(12) United States Patent
Leng et al.

(10) Patent No.: US 11,387,180 B2
(45) Date of Patent: Jul. 12, 2022

(54) POWER MODULE INCLUDING A CARRIER ASSEMBLY WITH COMBINATION OF CIRCUIT BOARD AND LEAD FRAME

(71) Applicant: NIKO SEMICONDUCTOR CO., LTD., New Taipei (TW)

(72) Inventors: Chung-Ming Leng, New Taipei (TW); Chih-Cheng Hsieh, Taoyuan (TW)

(73) Assignee: NIKO SEMICONDUCTOR CO., LTD., New Taipei (TW)

( * ) Notice: Subject to any disclaimer, the term of this patent is extended or adjusted under 35 U.S.C. 154(b) by 183 days.

(21) Appl. No.: 16/930,324

(22) Filed: Jul. 16, 2020

(65) Prior Publication Data

US 2021/0057324 A1 Feb. 25, 2021

(30) Foreign Application Priority Data

Aug. 19, 2019 (TW) ................... 108129493

(51) Int. Cl.
| | | |
|---|---|---|
| *H01L 23/495* | (2006.01) | |
| *H01L 23/498* | (2006.01) | |
| *H01L 23/538* | (2006.01) | |
| *H05K 1/18* | (2006.01) | |
| *H05K 7/20* | (2006.01) | |
| *H05K 1/11* | (2006.01) | |
| *H01L 23/36* | (2006.01) | |

(52) U.S. Cl.
CPC ........ *H01L 23/49861* (2013.01); *H01L 23/36* (2013.01); *H01L 23/49541* (2013.01); *H01L 23/5385* (2013.01); *H05K 1/111* (2013.01); *H05K 1/181* (2013.01); *H05K 7/205* (2013.01)

(58) Field of Classification Search
CPC .............. H01L 23/49861; H01L 23/36; H01L 23/49541; H01L 23/5385; H05K 1/111; H05K 1/181; H05K 7/205
USPC ........................................................ 257/666
See application file for complete search history.

(56) References Cited

FOREIGN PATENT DOCUMENTS

| | | |
|---|---|---|
| CN | 101273453 A | 9/2008 |
| TW | 200908172 A | 2/2009 |
| TW | 201036119 A1 | 10/2010 |
| TW | 201742229 A | 12/2017 |

*Primary Examiner* — Caleb E Henry
*Assistant Examiner* — Dilinh P Nguyen
(74) *Attorney, Agent, or Firm* — Li & Cai Intellectual Property Office

(57) ABSTRACT

A power module including a carrier assembly and a power device disposed on the carrier assembly is provided. The carrier assembly includes a bottom board, a circuit board, a lead frame, and a pad group. The circuit board is disposed on the bottom board and includes a device mounting portion and an extending portion protruding from a side of the device mounting portion. The lead frame disposed on the bottom board includes a first conductive portion and a second conductive portion insulated from each other. The extending portion of the circuit board is disposed between the first and second conductive portions, and an upper surface of the lead frame is flush with a top surface of the extending portion. A pad group includes a first pad disposed on the extending portion, a second pad and a third pad respectively disposed on the first and second conductive portions.

11 Claims, 9 Drawing Sheets

POWER MODULE INCLUDING A CARRIER ASSEMBLY WITH COMBINATION OF CIRCUIT BOARD AND LEAD FRAME

CROSS-REFERENCE TO RELATED PATENT APPLICATION

This application claims the benefit of priority to Taiwan Patent Application No. 108129493, filed on Aug. 19, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a power module, and more particularly to a power module for high power operation.

BACKGROUND OF THE DISCLOSURE

A power module can be implemented in a domestic frequency conversion system, an electric vehicle, and an industrial control system to convert electric power or control circuit. A power component, a gate driving component, and a control component are usually used in a conventional circuit system. In a conventional technology, a specific circuit layout is usually formed in advance in a printed circuit board based on a circuit design. Subsequently, a plurality of discrete power components, a control component, a gate driving component and other related components are mounted on the printed circuit board so as to integrate into a power module.

However, in some circuits, such as a voltage converter circuit, since the power module may be required to operate under a high voltage or high current condition, the power module would generate much heat during the operation thereof. Accordingly, the power module is required to not only withstand a high voltage and a high current, but also to have a great heat dissipation capability.

SUMMARY OF THE DISCLOSURE

In response to the above-referenced technical inadequacies, the present disclosure provides a power module that is adapted to operate under a high voltage or high current condition, and has a great heat dissipation capability. In one aspect, the present disclosure provides a power module, which includes a carrier assembly and at least one power device. The carrier assembly includes a bottom board, a circuit board, a lead frame, and a pad group. The circuit board is disposed on a supporting surface of the bottom board. The circuit board includes a device mounting portion and an extending portion that protrudes from a side of the device mounting portion. The lead frame is disposed on the bottom board and includes a first conductive portion and a second conductive portion that are insulated from each other. The extending portion of the circuit board is disposed between the first conductive portion and the second conductive portion, and an upper surface of the lead frame is flush with a top surface of the extending portion. A pad group includes a first pad, a second pad, and a third pad. The first pad is disposed on the extending portion, and the second pad and the third pad are respectively disposed on the first conductive portion and the second conductive portion. The at least one power device is disposed on the carrier assembly by the pad group.

In certain embodiments, the present disclosure provides a power module that includes a carrier assembly and two power devices. The carrier assembly includes a bottom board, a circuit board, a lead frame, and two pad groups. The circuit board is disposed on a supporting surface of the bottom board. The circuit board includes a device mounting portion and two extending portions that protrude from the same side of the device mounting portion. The lead frame is disposed on the bottom board and includes a first conductive portion, a second conductive portion and a third conductive portion that are spaced apart and insulated from one another, the first and third conductive portions being located at two opposite sides of the second conductive portion, respectively. One of the two extending portions is disposed between the first and second conductive portions, and the other one of the two extending portions is disposed between the second and third conductive portions, and an upper surface of the lead frame is flush with a top surface of each of the two extending portions. Each of the two pad groups includes a first pad, a second pad, and a third pad. The first, second, and third pads of one of the two pad groups are respectively disposed on one of the two extending portions, the first conductive portion, and the second conductive portion; and the first, second, and third pads of the other one of the two pad groups are respectively disposed on the other one of the two extending portions, the second conductive portion, and the third conductive portion. One of the power devices is disposed, through one of the two pad groups, on the first conductive portion, the second conductive portion and one of the two extending portions disposed therebetween. The other power device is disposed, through the other one of the two pad groups, on the second conductive portion, the third conductive portion, and the other one of the two extending portions disposed therebetween. The two power devices are electrically connected to each other in series through the second conductive portion.

Therefore, one of the advantages of the present disclosure is that in the power module and the carrier assembly provided in the present disclosure, by the technical features of "the extending portion of the circuit board being disposed between the first conductive portion and the second conductive portion" and "the upper surface of the lead frame being flush with the top surface of the extending portion," the power module can operate under a high voltage or high current condition and have a great heat dissipation capability.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
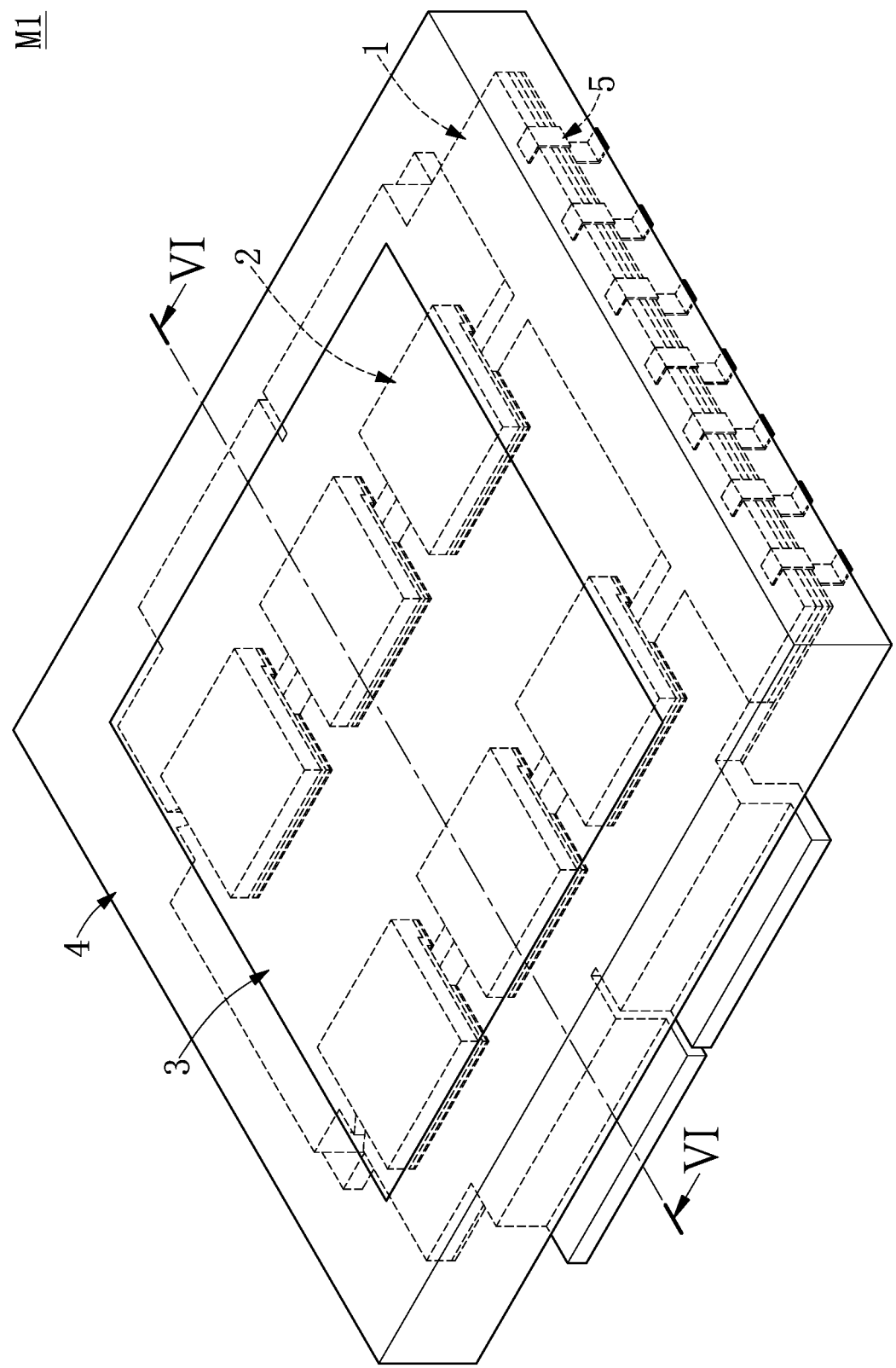
FIG. 1 is a perspective schematic view of the power module according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
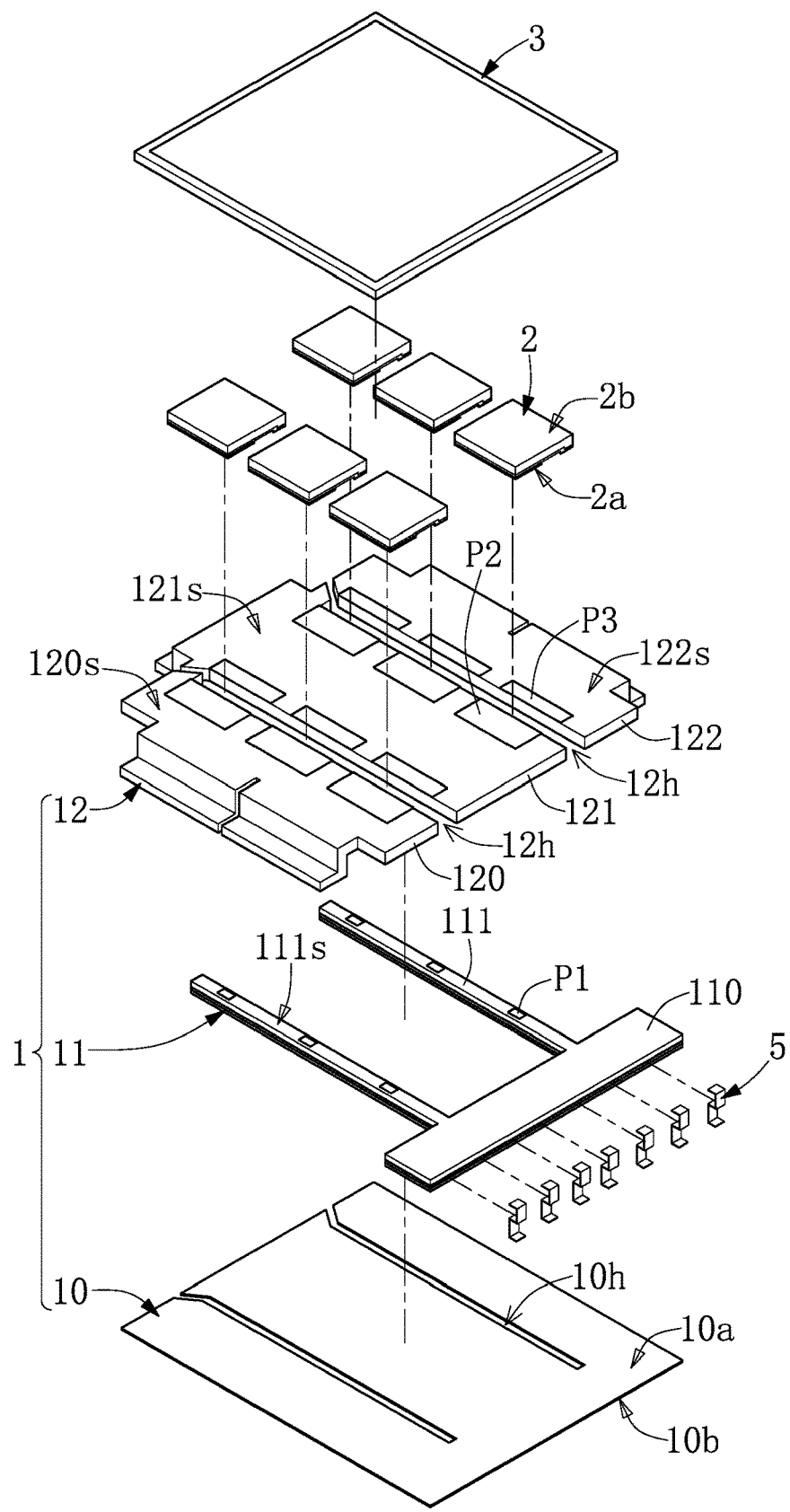
FIG. 2 is an exploded view of the power module according to the first embodiment of the present disclosure.
Figure 3:
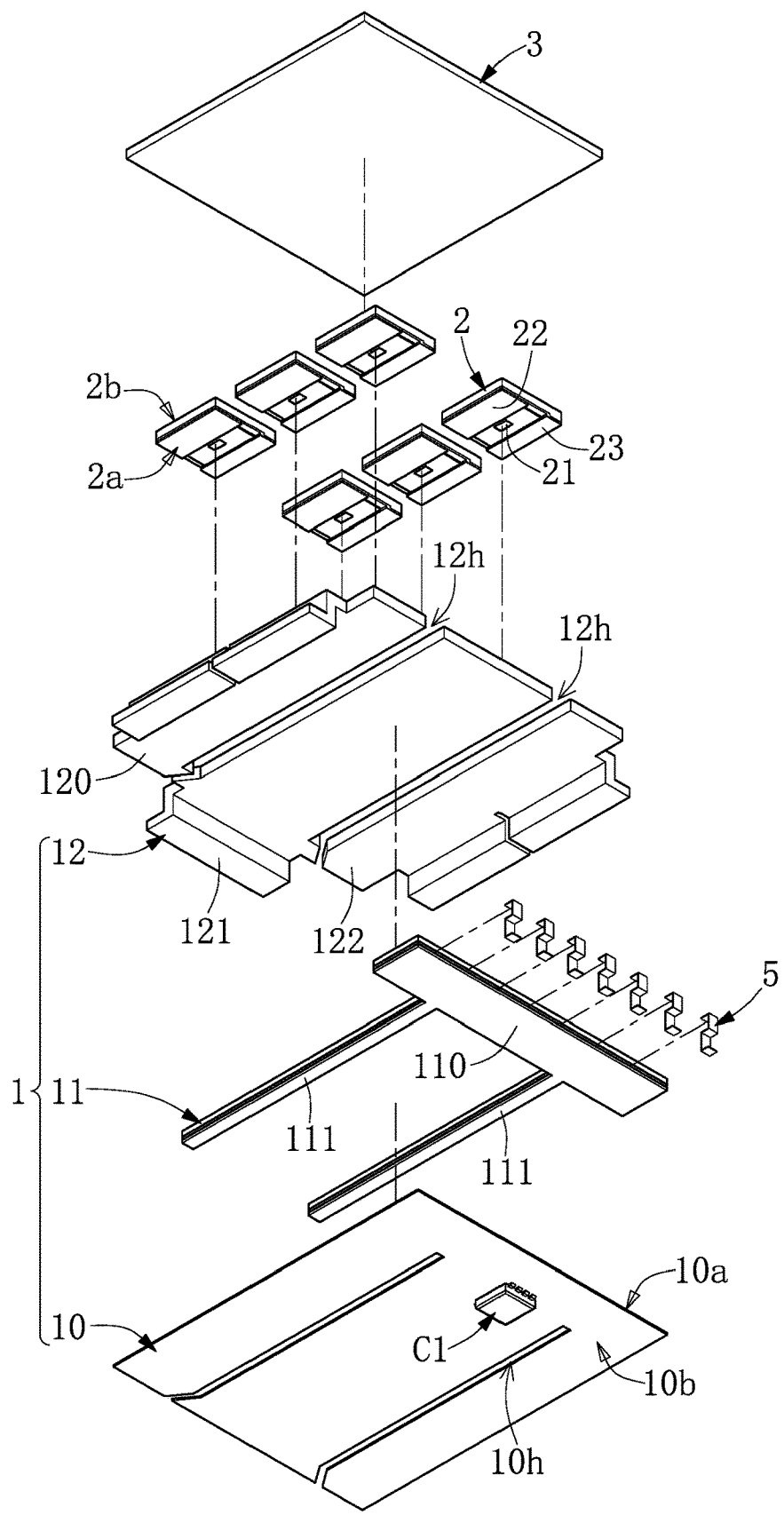
FIG. 3 is an exploded view of the power module from another viewpoint according to the first embodiment of the present disclosure.
Figure 4:
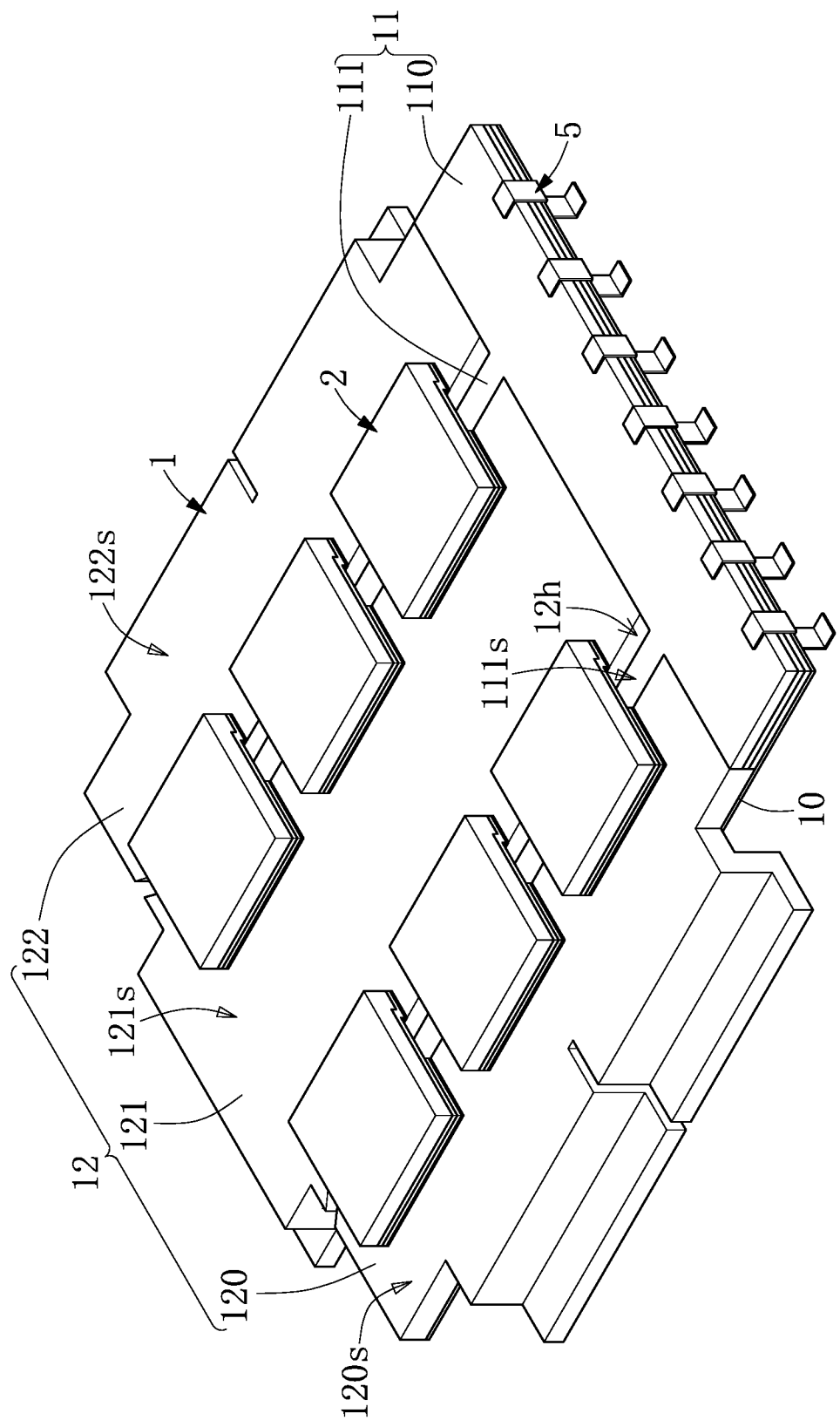
FIG. 4 is a perspective schematic view of the power module in which a thermal dissipation plate and a molding layer are omitted according to the first embodiment of the present disclosure.

Reference is made to FIG. 1 to FIG. 4. FIG. 1 is a perspective schematic view of the power module according to a first embodiment of the present disclosure. FIG. 2 is an exploded view of the power module according to the first embodiment of the present disclosure. FIG. 3 is an exploded view of the power module from another viewpoint according to the first embodiment of the present disclosure. FIG. 4 is a perspective schematic view of the power module in which a thermal dissipation plate and a molding layer are omitted according to the first embodiment of the present disclosure.

As shown in FIG. 1, the power module M1 includes a carrier assembly 1, at least one power device 2 (more than one power device is exemplified in FIG. 1), a thermal dissipation plate 3, a plurality of input/output pins 5, and a molding layer 4.

In the instant embodiment, the power devices 2 are disposed on the carrier assembly 1. The power devices 2 can be insulated gate bipolar transistors (IGBT), metal-oxide-semiconductor field effect transistors (MOSFET), or any combination thereof. The material of the power device 2 can be silicon carbide, silicon, or gallium nitride. In another embodiment, the power module M1 further includes a diode device, such as a fast recovery diode (FRD) or a power diode.

It should be noted that the carrier assembly 1 of the instant embodiment is used not only for supporting the power devices 2, but can also serve as an electrical transmission structure among the power devices 2. Accordingly, the power devices 2 can be electrically connected to one another through the carrier assembly 1. The details of the carrier assembly 1 will be described in the following description.

Furthermore, the number of the power devices 2 and the manner for establishing electrical connections among the power devices 2 can be adjusted according to particular implementations and is not limited in the present disclosure. In one embodiment, when the power module M1 is applied in a voltage converter circuit, three of the power devices 2 that are arranged in the same row are electrically connected in parallel. Moreover, two of the power devices 2 that are respectively located at different rows, but arranged in the same column, are electrically connected to each other in series. That is to say, in the same column, the drain electrode of one of the power devices 2 can be electrically connected to the source electrode of the other one of the power devices 2 through the carrier assembly 1.

Furthermore, in the instant embodiment, the power module M1 can include other electronic devices, such as a control device, a passive device, a protection device, and so on. These electronic devices and the power devices can be jointly disposed on the carrier assembly 1 and electrically connected to one another through the carrier assembly 1 so as to form a part of a standardized circuit.

The thermal dissipation plate 3 is disposed on the power devices 2 so as to dissipate heat generated by the power devices 2 during operation thereof. In one embodiment, the thermal dissipation plate 3 is, for example, a direct bonded copper (DBC) or a direct plated copper (DPC), but the present disclosure is not limited to the examples provided herein.

The input/output pins 5 are disposed at one side of the carrier assembly 1 so that the power module M1 can be electrically connected to another external circuit. The input/output pins 5 can be defined to output or input different signals, respectively.

The molding layer 4 covers the carrier assembly 1 and the power devices 2. However, connecting portions (that are not designated by any reference numeral) of the lead frame 12 and the input/output pins 5 are exposed from the molding layer 4. That is to say, while the power module M1 is disposed on another control printed circuit board (not shown), by arranging the input/output pins 5 of the power module M1 and the connecting portions on the corresponding positions of the control printed circuit board, respectively, the power devices 2 of the power module M1 and the other electronic devices can be electrically connected to or incorporated into a system circuit of the control printed circuit board.

The detailed structure of the carrier assembly 1 and the electrical connection relationship among the carrier assembly 1 and the power devices 2 in an embodiment of the present disclosure are further described in the following descriptions. In the instant embodiment, a part of a voltage converter circuit is exemplified for description.

Reference is made to FIG. 2 and FIG. 3. The carrier assembly 1 includes a bottom board 10, a circuit board 11, a lead frame 12 and at least one pad group (a plurality of pad groups are exemplified).

The bottom board 10 has a supporting surface 10a and a bottom surface 10b opposite to the supporting surface 10a. In one embodiment, the bottom board 10 is a wiring board, in which a plurality of traces (not shown) has been formed on one of the surfaces (the supporting surface 10a or the bottom surface 10b) and in the interior of the bottom board 10.

Accordingly, the bottom board 10 can be disposed with other devices according to a practical circuit. Reference is made to FIG. 3. In the instant embodiment, the power module M1 further includes a control device C1, and the control device C1 is disposed at the bottom surface 10b of the bottom board 10.

Furthermore, the bottom board 10 has at least one trench 10h (two trenches are illustrated to be exemplified). As shown in FIG. 2 each trench 10h extends from one side toward another side of the bottom board 10. Each of the trenches 10h has an open end (not labelled) and a closed end (not labelled).

It is worth mentioning that by using the bottom board 10 having the trenches 10h, the power module M1 can withstand higher voltage. In one embodiment, by forming the trenches 10h at the bottom board 10, the withstand voltage of the power module M1 can be at least 600V.

The circuit board 11 and the lead frame 12 are jointly disposed on the supporting surface 10a of the bottom board 10. In the instant embodiment, the circuit board 11 and the lead frame 12 are complementary to each other in shape so as to be jointly arranged on the bottom board 10. It should be noted that the circuit board 11 is a laminated board including a plurality of insulating layers and a plurality of wiring layers which are alternately stacked on one another. Furthermore, a layout of each wiring layer in the circuit board 11 can be designed according to a practical implementation and is not limited herein.

As shown in FIG. 2 and FIG. 3, in the instant embodiment, the circuit board 11 has a device mounting portion 110 and at least one extending portion 111. One or more electronic devices, such as a control device, a protection device, or a passive device, can be disposed on the device mounting portion 110. Accordingly, the layout of the wiring layer either in the interior or on the surface of the circuit board 11 can be adjusted according to the type of required electronic device that may be disposed on the circuit board 11.

As such, the power module M1 of the embodiment in the present disclosure can be compatible with many kinds of standardized circuits and thus has a better scalability or expandability of components. In another embodiment, the position of the control device C1 can be changed from the bottom surface 10b of the bottom board 10 to the device mounting portion 110 of the circuit board 11. In yet another embodiment, the control device C1 is disposed at the bottom surface 10b of the bottom board 10, while the protection device or the passive device can be disposed on the device mounting portion 110.

When the circuit board 11 is disposed on the bottom board 10, the device mounting portion 110 is near the closed ends of the trenches 10h but does not overlap with each one of the trenches 10h. That is to say, the device mounting portion 110 does not cover any one of the trenches 10h.

As shown in FIG. 2 and FIG. 3, the circuit board 11 further includes two extending portions 111. The two extending portions 111 protrude from the same side of the device mounting portion 110 and extend in substantially the same direction. In the instant embodiment, each of the two extending portions 111 extends in a direction from the closed end toward the open end of each trench 10h.

Furthermore, when the circuit board 11 is disposed on the supporting surface 10a, the two extending portions 111 are disposed proximate to the two trenches 10h, respectively. It should be noted that in one embodiment, each of the two extending portions 111 is offset vertically from the adjacent one of the trenches 10h.

The lead frame 12 is shaped to complement the shape of the circuit board 11 and includes a plurality of conductive portions that are spaced apart and insulated from one another. Specifically, as shown in FIG. 2 and FIG. 3, the lead frame 12 includes a first conductive portion 120, a second conductive portion 121, and a third conductive portion 122 that are spaced apart from one another, the second conductive portion 121 being located between the first conductive portion 120 and the third conductive portion 122.

In the instant embodiment, one of the two extending portions 111 of the circuit board 11 is disposed between the first and second conductive portions 120, 121, and the other extending portion 111 is disposed between the second and third conductive portions 121, 122.

Reference is made to FIG. 2 to FIG. 5. To be more specific, the first and second conductive portions 120, 121 are spaced apart from each other to define a strip-shaped opening 12h therebetween. The second and third conductive portions 121, 122 are spaced apart from each other to define another strip-shaped opening 12h therebetween. Furthermore, each of the two extending portions 111 is substantially in a strip shape from a top view, and respectively received in the strip-shaped openings 12h defined by the first, second and third conductive portions 120, 121, 122.

In the instant embodiment, each strip-shaped opening 12h has a width W2 greater than a width W1 of each trench 10h. Furthermore, when the lead frame 12 is disposed on the bottom board 10, each of the strip-shaped openings 12h overlaps with and is in spatial communication with one of the trenches 10h in a thickness direction of the bottom board 10.

Figure 5:
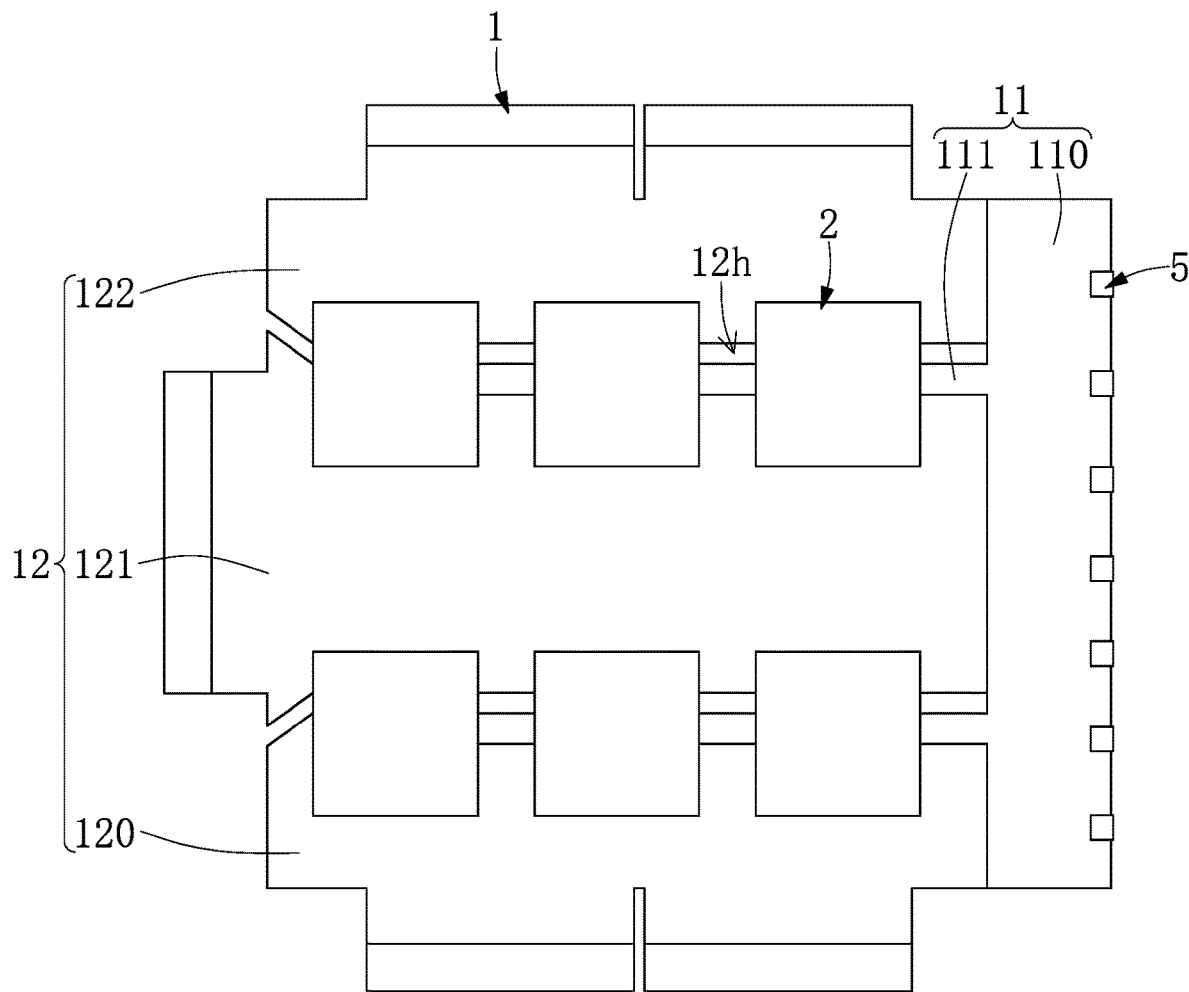
FIG. 5 is a top view of the power module shown in FIG. 4.

As shown in FIG. 5, each of the two extending portions 111 is located in the corresponding one of the strip-shaped openings 12h, and each of the two extending portions 111 is arranged with one side thereof being substantially parallel to an extending direction of the corresponding trench 10h on the bottom board 10. In other words, each of the two extending portions 111 does not cover the adjacent trench 10h, so that the withstand voltage of the power module M1 can be improved. In one embodiment, the width W2 of each strip-shaped opening 12h is larger than a sum of a width of each extending portion 111 and the width W1 of each trench 10h to prevent the trenches 10h from being covered by either the two extending portions 111 or the lead frame 12.

Reference is made to FIG. 4 and FIG. 5. Furthermore, an upper surface of the lead frame 12 and a top surface of each of the two extending portions 111 are flush with each other. Specifically, the upper surface 120s of the first conductive portion 120, the upper surface 121s of the second conductive portion 121, and the upper surface 122s of the third conductive portion 122 are coplanar with the top surfaces 111s of the two extending portions 111.

Reference is made to FIG. 2 and FIG. 3 again. At least one pad group (a plurality of pad groups are exemplified) is disposed on the circuit board 11 and the lead frame 12. To be more specific, the number of the pad groups can be determined based on the number of the devices (i.e., the power devices 2 or the diode devices) to be disposed.

Furthermore, each of the pad groups can include a plurality of pads. The number of the pads can be determined according to the type of the device to be disposed on the carrier assembly 1. In one embodiment, since the device to be disposed on the carrier assembly 1 is a power device, one of the pad groups includes a first pad P1, a second pad P2, and a third pad P3. In another embodiment, when the device to be disposed on the carrier assembly 1 is a diode device, one of the pad groups can include only a cathode pad and an anode pad. The aforementioned diode device can be a fast recovery diode (FRD) or a power diode.

Moreover, a position where each power device 2 is disposed can be defined by the position of each pad group. Reference is made to FIG. 2. The first pad P1 of one of the pad groups (at the left side) is arranged on the extending portion 111 of the circuit board 11, and the second and third pads P2, P3 are respectively arranged on the first and second conductive portions 120, 121. The first pad P1 of another one of the pad groups (at the right side) is arranged on the other extending portion 111 of the circuit board 11, and the second and third pads P2, P3 are respectively arranged on the second and third conductive portions 121, 122.

As shown in FIG. 3, in the instant embodiment, each of the power devices 2 has an assembly side 2a and a rear side 2b opposite to the assembly side 2a. Each of the power devices 2 further includes a gate electrode 21, a drain electrode 23, and a source electrode 22 that are located at the assembly side 2a, the gate electrode 21 being located between the drain electrode 23 and the source electrode 22.

Figure 6:
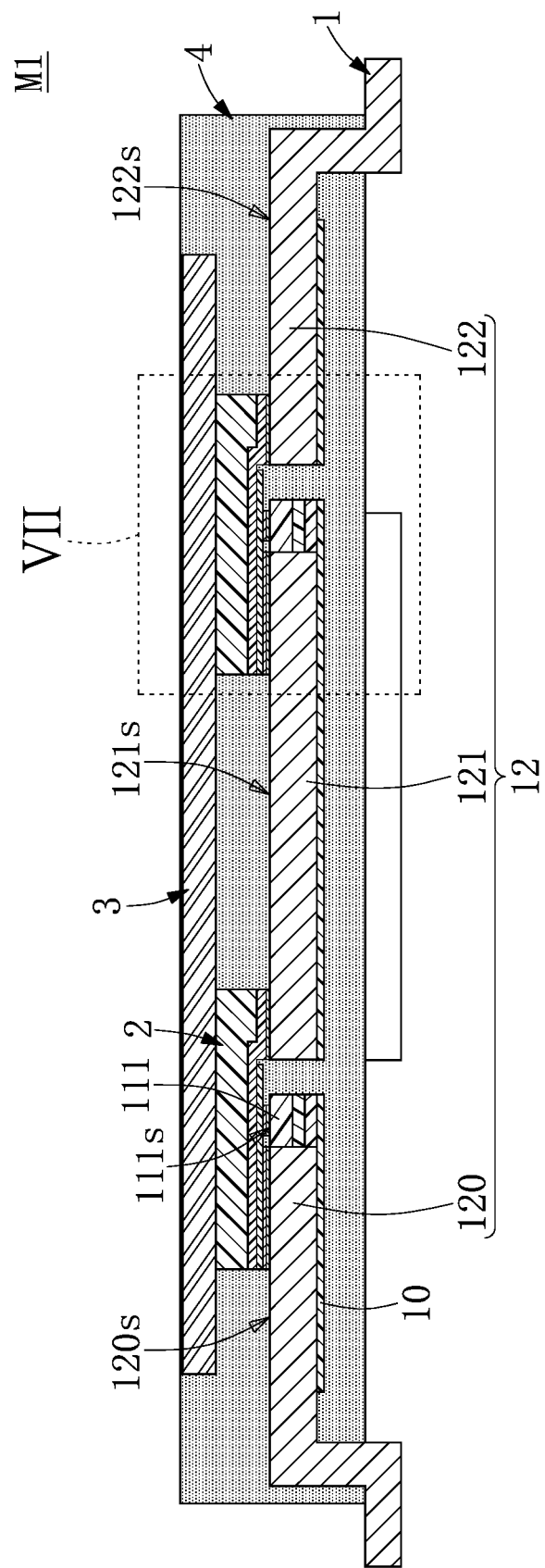
FIG. 6 is a cross-sectional view taken along line VI-VI of FIG. 1.
Figure 7:
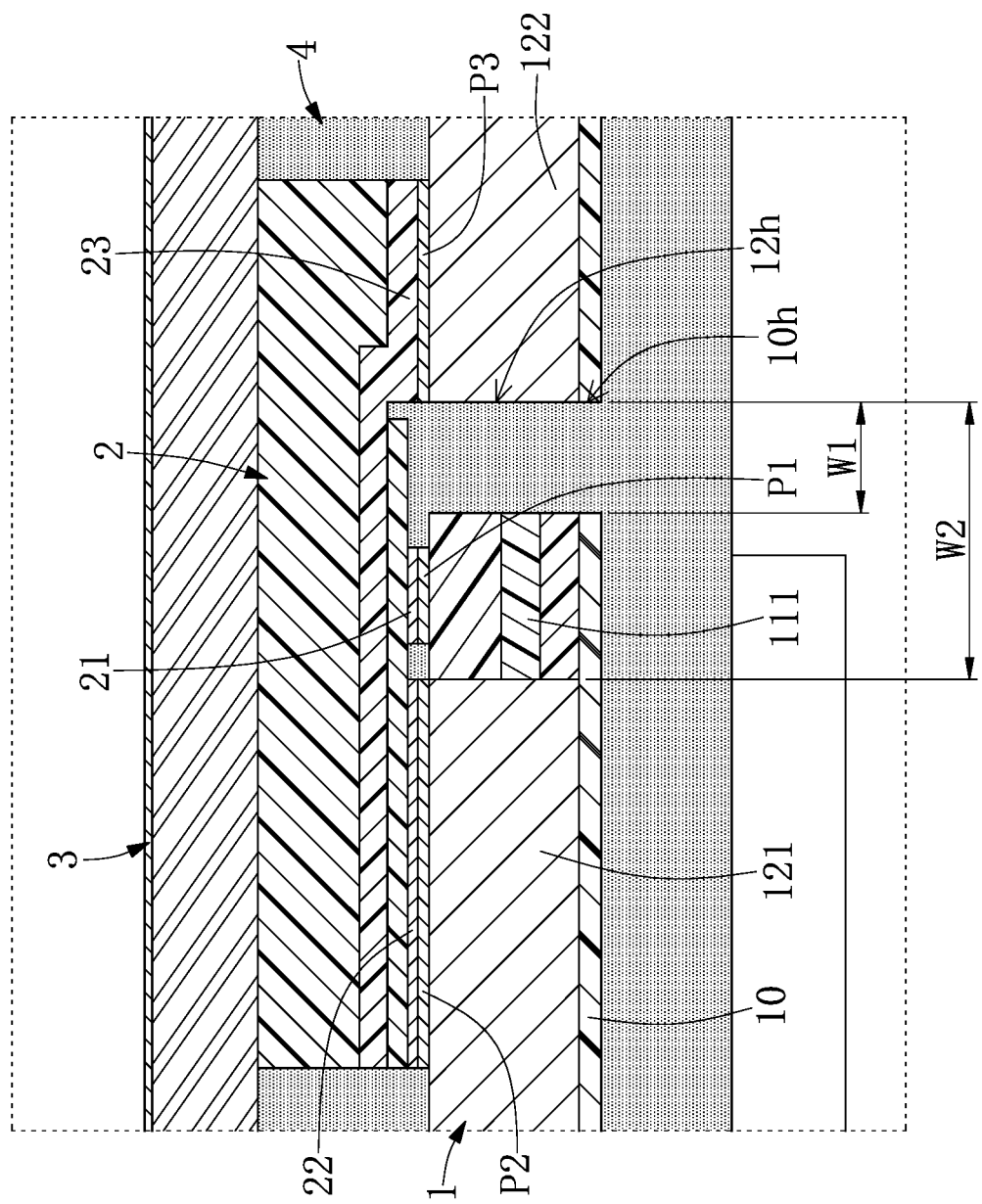
FIG. 7 shows an enlarged view of a region VII shown in FIG. 6.

Reference is made to FIG. 6 and FIG. 7, in which FIG. 6 is a cross-sectional view taken along line VI-VI of FIG. 1, and FIG. 7 shows an enlarged view of a region VII shown in FIG. 6. When the power devices 2 are disposed on the carrier assembly 1, the assembly side 2a of each power device 2 faces toward the lead frame 12 and the circuit board 11. Accordingly, the gate electrode 21, the source electrode 22, and the drain electrode 23 are respectively connected to the first pad P1, the second pad P2, and the third pad P3.

That is to say, the gate electrode 21 of each power device 2 can be electrically connected to the control device C1 that is disposed on either the bottom board 10 or the circuit board 11. Therefore, through the circuit board 11, the control device C1 can control each power device 2 to switch on or off.

Furthermore, the source electrode 22 and the drain electrode 23 of one of the power devices 2 at the left side are electrically connected to the first and second conductive portions 120, 121 of the lead frame 12, respectively. Similarly, the source electrode 22 and the drain electrode 23 of another one of the power devices 2 at the right side are electrically connected to the second and third conductive portions 121, 122 of the lead frame 12, respectively. Accordingly, when the power device 2 at the left side are switched on and a bias is applied between the first conductive portion 120 and the second conductive portion 121, a majority of current flows from the first conductive portion 120, and then passes through the power devices 2 to the second conductive portion 121.

Furthermore, in the instant embodiment, the lead frame 12 and the circuit board 11 can be arranged so that the power devices 2 (three of which are illustrated in FIG. 2) arranged along the same extending portion 111 can be electrically connected to one another in parallel. Moreover, two of the power devices 2, which are respectively connected to the two extending portions 111, are electrically connected to each other in series.

As shown in FIG. 6, the drain electrode 23 of one of the power devices 2 (at the left side) is connected to the third pad P3 on the second conductive portion 121, and the source electrode 22 of the other one of the power devices 2 (at the right side) is connected to the second pad P2 on the same conductive portion (i.e., the second conductive portion 121). That is to say, through one of the pad groups, one of the left-side power devices 2 is disposed on the first conductive portion 120, the second conductive portion 121, and one of the two extending portions 111 that is located between the first and second conductive portions 120, 121.

Through another pad group, one of the right-side power devices 2 is disposed on the second conductive portion 121, the third conductive portion 122, and the other one of the two extending portion 111 that is located between the second and third conductive portions 121, 122. Accordingly, the drain electrode 23 of one of the power devices 2 can be electrically connected to the source electrode of another one of the power devices 2 through the second conductive portion 121, such that the two adjacent ones of the power devices 2, which are respectively located at the left side and right side, can be electrically connected to each other in series.

It is worth mentioning that since in the power module M1 of the present disclosure, the lead frame 12 is electrically connected to the drain electrode 23 and the source electrode 22 of each of power devices 2, the power module M1 can withstand a higher surge current. In one embodiment, the power module M1 can withstand a surge current of at least 300 A.

In a conventional power module, since the power device thereof is disposed only on a printed circuit board, the conventional power module can only withstand a lower surge current of about 50 A to 70 A. In comparison, in the carrier assembly 1 of the power module M1 provided in the embodiment of the present disclosure, the lead frame 12 is combined with the circuit board 11 to cooperate with the operation of the power devices 2, which allows a larger current to pass therethrough. Furthermore, the lead frame 12 can be further used to dissipate heat generated by the power module M1 during its operation.

In another embodiment, the power module M1 can include at least one diode device, and an anode and a cathode of the at least one diode device are respectively connected to the second pad P1 and the third pad P3. That is to say, one of the power devices 2 can be replaced with the at least one diode device, and the at least one diode device can be electrically connected to other power devices 2 through the lead frame 12.

Figure 8:
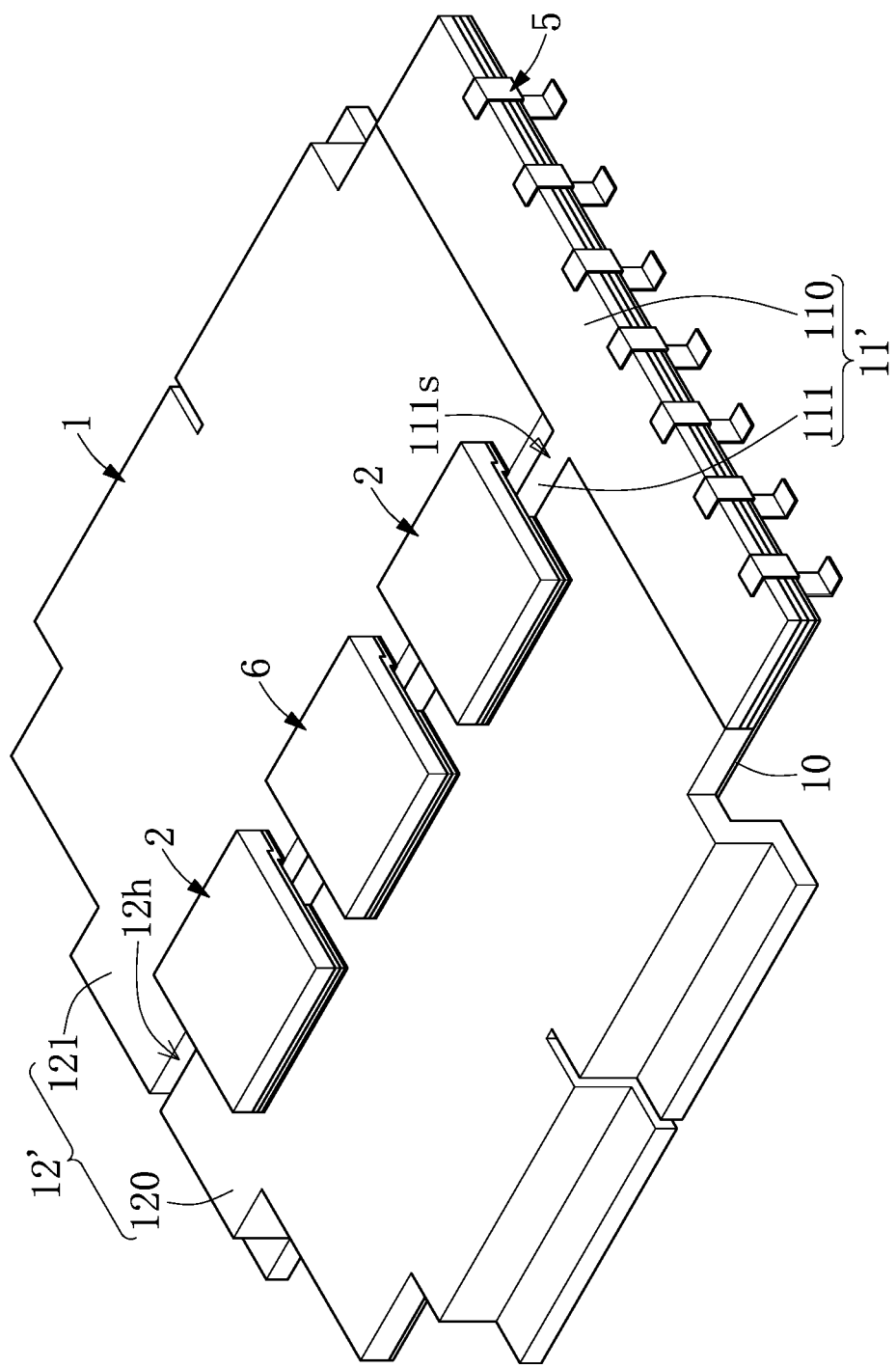
FIG. 8 is a perspective schematic view of a power module in which a thermal dissipation plate and a molding layer are omitted according to a second embodiment of the present disclosure.
Figure 9:
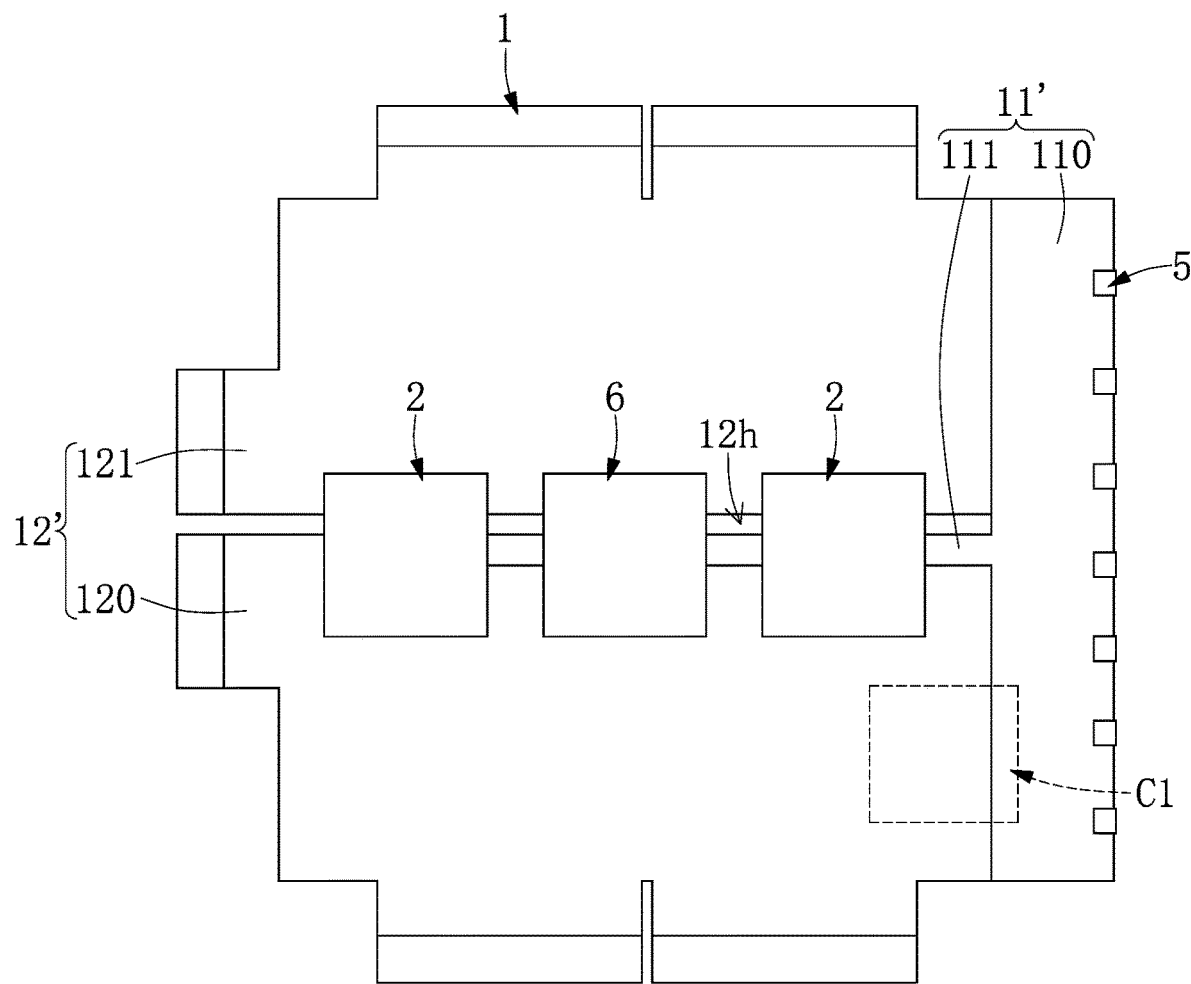
FIG. 9 is a top view of the power module shown in FIG. 8.

Reference is made to FIG. 8 and FIG. 9, in which FIG. 8 is a perspective schematic view of a power module in which a thermal dissipation plate and a molding layer are omitted according to a second embodiment of the present disclosure, and FIG. 9 is a top view of the power module shown in FIG. 8.

In the embodiment shown in FIG. 8, the circuit board 11' can include only one extending portion 111, and the lead frame 12' can include only a first conductive portion 120 and a second conductive portion 121 that are spaced apart from each other. That is to say, as long as the shape of the lead frame 12 can be complementary with the shape of the extending portion 111 of the circuit board 11, and the upper surface (including the upper surface 120s of the first conductive portion 120 and the upper surface 121s of the second conductive portion 121) of the lead frame 12 is coplanar (or flush) with the top surface 111s of the extending portion 111, the number of the extending portion 111 is not limited to the example provided herein.

Furthermore, in the instant embodiment, the power module M1 can further include a diode device 6, and two electrodes of the diode device 6 are electrically connected to the first and second conductive portions 120, 121, respectively. Accordingly, the two electrodes of the diode device 6 can be electrically connected to the source electrode 22 and the drain electrode 23 through the first and second conductive portions 120, 121, respectively. It is worth mentioning that in the instant embodiment, it is not necessary for the diode device 6 to be electrically connected to the pad disposed on the extending portion 111.

In conclusion, one of the advantages of the present disclosure is that in the power module and the carrier assembly provided in the present disclosure, by the technical features of "the extending portion 111 of the circuit board 11, 11' being disposed between the first conductive portion 120 and the second conductive portion 121 (or the second conductive portion 121 and the third conductive portion 122)" and "the upper surface of the lead frame 12, 12' being flush with the top surface 111s of the extending portion 111," the power module M1 can satisfy the requirements of withstanding high voltage and high current and have a great heat dissipation capability.

To be more specific, by using a combination of the circuit board 11(11') and the lead frame 12(12') in the carrier assembly 1 of the embodiment in the present disclosure, current paths can be increased to allow a large current to pass, and the carrier assembly 1 has a great heat dissipation capability. Furthermore, by arranging the trench 10h of the bottom board 10 and the strip-shaped opening 12h of the lead frame 12, 12' to overlap with each other in the thickness direction of the bottom board 10, the voltage withstanding capability of the power module M1 can be improved.

On the other hand, the bottom surface 10b of the bottom board 10 and the device mounting portion 110 of the circuit board 11, 11' can be disposed with a control device, a protective device, a passive device, or other electronic devices according to practical implementations, and the layouts of the wiring layers in the bottom board 10 and the circuit board 11, 11' can be adjusted to cooperate with the devices to be disposed. As such, the device expandability of the power module M1 can be improved.

It is worth noting that in the carrier assembly 1 of the embodiment provided in the present disclosure, the top surface 111s is flush with the upper surface of the lead frame 12, 12'. Accordingly, the power devices 2 or the diode device 6 can be directly mounted on the carrier assembly 1 by surface mounting technology (SMT) without using any bonding wire so as to simplify the fabrication process.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A power module, comprising:
   a carrier assembly including:
      a bottom board;
      a circuit board disposed on a supporting surface of the bottom board, wherein the circuit board includes a device mounting portion and an extending portion that protrudes from a side of the device mounting portion;
      a lead frame disposed on the bottom board and including a first conductive portion and a second conductive portion that are insulated from each other, wherein the extending portion of the circuit board is disposed between the first conductive portion and the second conductive portion, and an upper surface of the lead frame is flush with a top surface of the extending portion; and
      a pad group including a first pad, a second pad, and a third pad, wherein the first pad is disposed on the extending portion, the second pad and the third pad are respectively disposed on the first conductive portion and the second conductive portion; and
   at least one power device disposed on the carrier assembly by the pad group.

2. The power module according to claim 1, wherein the first conductive portion and the second conductive portion are spaced apart from each other to define a strip-shaped opening, and the extending portion is received in the strip-shaped opening.

3. The power module according to claim 2, wherein the bottom board includes at least one trench, and a width of the at least one trench is less than that of the strip-shaped opening, the strip-shaped opening overlaps with the at least one trench in a thickness direction of the bottom board, and the extending portion is offset from the trench.

4. The power module according to claim 1, wherein the at least one power device has a gate electrode, a drain electrode, and a source electrode which are disposed at an assembly side thereof, and the at least one power device is disposed on the carrier assembly with the assembly side facing toward the lead frame and the circuit board, and wherein the gate electrode, the source electrode, and the drain electrode are connected to the first pad, the second pad, and the third pad, respectively.

5. The power module according to claim 1, further including a thermal dissipation plate disposed on the at least one power device.

6. The power module according to claim 1, further including a control device disposed at the device mounting portion or a bottom surface of the bottom board, wherein the control device is electrically connected to the at least one power device through the circuit board.

7. The power module according to claim 1, further including a diode device disposed on the carrier assembly and electrically connected to the at least one power device through the first conductive portion and the second conductive portion.

8. A power module, comprising:
a carrier assembly including:
a bottom board;
a circuit board disposed on a supporting surface of the bottom board, wherein the circuit board includes a device mounting portion and two extending portions that protrude from the same side of the device mounting portion;
a lead frame disposed on the bottom board and including a first conductive portion, a second conductive portion and a third conductive portion that are spaced apart and insulated from one another, wherein the first and third conductive portions are located at two opposite sides of the second conductive portion, respectively, and wherein one of the two extending portions is disposed between the first and second conductive portions, and the other one of the two extending portions is disposed between the second and third conductive portions, and an upper surface of the lead frame is flush with a top surface of each of the two extending portions; and
two pad groups, each of the two pad groups including a first pad, a second pad, and a third pad, wherein the first, second, and third pads of one of the two pad groups are respectively disposed on one of the two extending portions, the first conductive portion, and the second conductive portion, and the first, second, and third pads of the other one of the pad groups are respectively disposed on the other one of the two extending portions, the second conductive portion, and the third conductive portion; and
two power devices, wherein one of the power devices is disposed on the first conductive portion, the second conductive portion and one of the two extending portions disposed therebetween through one of the pad groups, and the other power device is disposed on the second conductive portion, the third conductive portion, and the other one of the two extending portions disposed therebetween through the other one of the pad groups, and the two power devices are electrically connected to each other in series through the second conductive portion.

9. The power module according to claim 8, wherein the first conductive portion, the second conductive portion, and the third conductive portion are spaced apart from one another to define two strip-shaped openings, and the two extending portions are respectively received in the two strip-shaped openings.

10. The power module according to claim 8, wherein the bottom board has two trenches, each of the two trenches overlaps with the corresponding one of the strip-shaped openings in a thickness direction of the bottom board, and each of the two trenches has a width less than a width of the corresponding one of the strip-shaped openings, and each of the two extending portions does not cover each of the two trenches.

11. The power module according to claim 8, further including a control device disposed on the device mounting portion or a bottom surface of the bottom board, wherein the control device is electrically connected to at least one of the power devices through the circuit board.

* * * * *